United States Patent [19]

DeFreitas

[11] 4,190,801
[45] Feb. 26, 1980

[54] DIGITAL ENCODING CIRCUITRY

[75] Inventor: Richard E. DeFreitas, Westford, Mass.

[73] Assignee: DeltaLab Research, Inc., Chelmsford, Mass.

[21] Appl. No.: 875,336

[22] Filed: Feb. 6, 1978

[51] Int. Cl.$^2$ .......................................... H03K 13/22
[52] U.S. Cl. ............................... 325/38 B; 332/11 D
[58] Field of Search ................... 325/38 B; 332/11 D; 340/347 NT; 179/15 AU

[56] References Cited

U.S. PATENT DOCUMENTS

| | | | |
|---|---|---|---|
| 3,109,987 | 11/1963 | Linder | 325/38 |
| 3,490,045 | 1/1970 | de Boer | 325/38 |
| 3,582,784 | 6/1971 | Gaunt | 325/38 |
| 3,831,092 | 8/1974 | Greefkes | 325/38 B |
| 3,857,111 | 12/1974 | Deschênes | 325/38 B |
| 3,918,042 | 11/1975 | Werner | 325/38 R |
| 3,995,217 | 11/1976 | Smith | 325/38 B |
| 4,071,825 | 1/1978 | McGuffin | 325/38 B |

OTHER PUBLICATIONS

HR-3210 All-Digital Continuously Variable Slope Delta Modulator, Harris Corporation 1976.
Motorola Semiconductors XC 3417, XC 3418, Motorola, Inc. 1977.
The FX-209 Delta Modulator, Consumer Microcircuits of America.

Primary Examiner—Robert L. Griffin
Assistant Examiner—Michael A. Masinick

[57] ABSTRACT

In an electrical system of the type in which a digitally encoded signal is determined at least in part by the difference between a present value of an input signal and a reference signal representative of a past value of the input signal, improved circuitry for generating the reference signal. The improved circuitry comprises extraction means including a filter for extracting from the pattern of bits in the digitally encoded signal information relating to the time derivative of the present value of the input signal to provide a corresponding control signal, and integrating means responsive to the control signal to provide the reference signal.

24 Claims, 2 Drawing Figures

DIGITAL ENCODING CIRCUITRY

BACKGROUND OF THE INVENTION

This invention relates to digitally encoding and decoding electrical signals, e.g., to efficiently store music on magnetic tape.

In a continuously variable slope delta (CVSD) encoding system, the encoded signal represents the slopes of individual line segments which together approximate the input signal, and is generated by determining, for each segment, the difference between the input signal and a reference signal whose value is determined by the previous segments of the input signal. In the most rudimentary delta encoding system, the digital output of the encoder represents, at sequential points in time, whether the input signal is greater or less than the reference, and the reference is increased or decreased, at a constant rate, accordingly.

To improve the accuracy of the encoding and reduce the quantization noise introduced by the encoding process, a CVSD system increases and decreases the reference signal at a variable rate corresponding as closely as possible to the magnitude of the instantaneous slope of the input signal.

The Harris, Inc. HR-3210 and the Motorola, Inc. XC3417/18 modulators/demodulators have syllabic filters examining the digital output to detect continuous series of 1's or 0's, indicating a too great or too small rate of change of the reference, and modifying that rate accordingly. In De Boer et al. U.S. Pat. No. 3,490,045, the digital output is integrated to obtain a voltage representing the relative occurrence of 1's and 0's in the output and, if the resulting voltage exceeds a threshold, the rate of change of the reference is changed accordingly. Linder U.S. Pat. No. 3,109,987 and Gaunt U.S. Pat. No. 3,582,784 show encoders wherein the previous rate of change of the reference is detected and utilized to determine the future rate of change.

SUMMARY OF THE INVENTION

My invention features a reference signal generating circuit having a filter for extracting from the pattern of digital output bits information relating to the time derivative of the input signal, to provide a control signal for an integrator which, in turn, generates the reference. As the control signal varies with the derivative of the input signal, the rate of change of the reference is greater for more rapidly varying input signals and less for less rapidly varying input signals, so that the reference closely follows the input signal and the quantization noise is minimized.

In preferred embodiments, the control signal is fed back to the input of the filter and gated by the digital output, so that the rate of change of the control signal, and thus of the reference, is dependent upon previous values of the control signal, thus providing excellent response against frequency and amplitude variations in the input signal.

DESCRIPTION OF THE PREFERRED EMBODIMENT

We turn now to the circuitry and operation of a preferred embodiment of the invention, after first briefly describing the drawings.

DRAWINGS

CIRCUITRY

Figure 1:
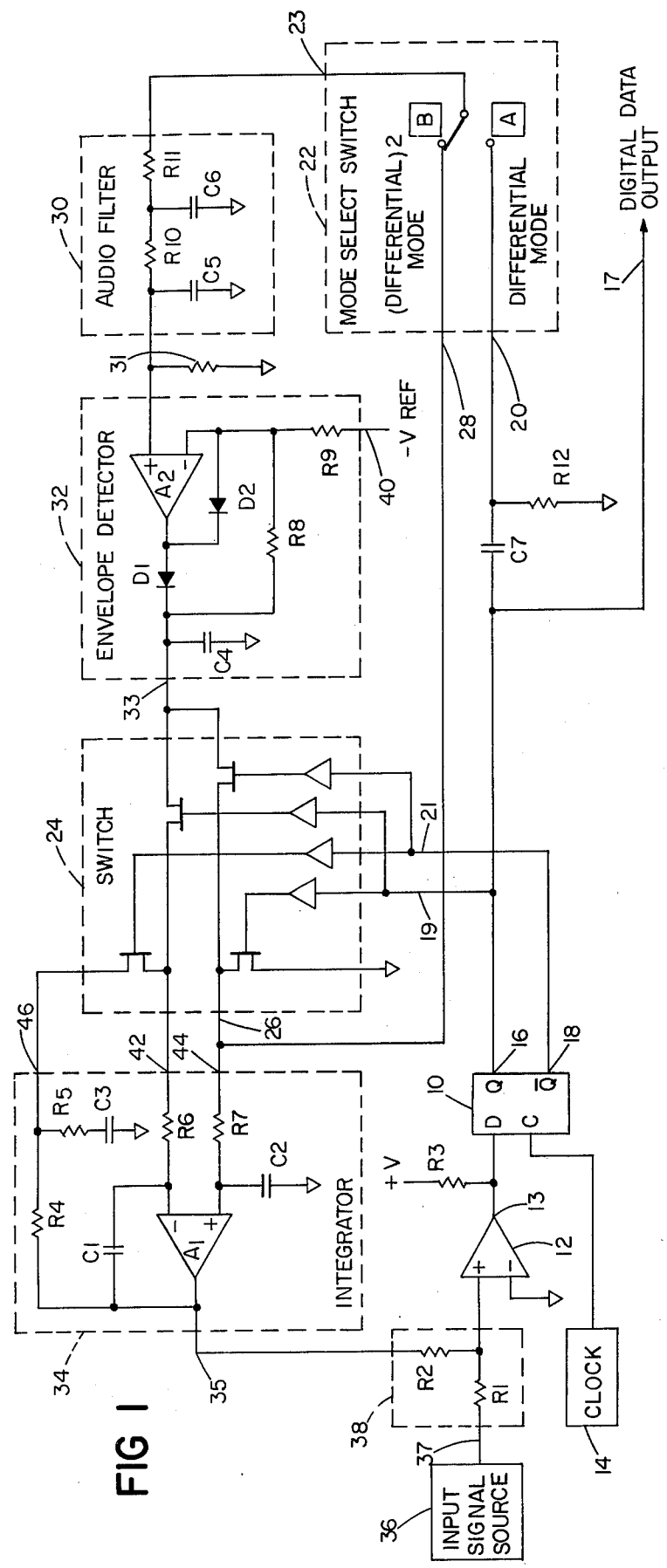
FIG. 1 is a schematic diagram of a CVSD encoder embodying the invention.

Referring to FIG. 1, D type flip-flop 10 is connected to sample output 13 of comparator 12 at a rate controlled by 250 KHz clock 14, to provide mutually inverted outputs 16 and 18. Output 16 is connected to encoded signal output 17 of the encoder and to differential input 20 of mode select switch 22, and outputs 16 and 18 are connected to the control inputs 19 and 21 of integrator switch 24. Output 26 of switch 24 is connected to (differential)$^2$ input 28 of switch 22, and output 23 of switch 22 is connected to the series combination of filter 30, envelope detector 32, switch 24, and differential integrator 34. Output 35 of integrator 34 and output 37 of audio signal source 36 are connected to summing point 38 to provide the input to comparator 12.

Filter 30 is a pi section lowpass filter having a bandwidth of 25 KHz, approximately 1.7 times the 15 KHz bandwidth of the input signal, with resistor 31 assisting to shape the frequency response of the filter. Envelope detector 32 is a half wave rectifier having a hold time constant in the range of 50 to 70 ms, and preferably 60 ms, and a full scale (10 v) slew time of 1667 $\mu$s. Integrator switch 24 is a solid state C-MOS analog switch containing four independently controlled switches and shown here in block diagram form to illustrate the operation of the encoder. Integrator 34 is self-stabilized with a selectable positive or negative integration slew rate of 0.25 v/$\mu$s at a maximum control signal of 10 volts and a slew rate of 2.5 mv/$\mu$s at a control signal of 0.1 volts.

The following table contains the circuit components used in the circuit of FIG. 1, and are optimum for the (differential)$^2$ mode of operation.

COMPONENT TABLE

R1-10 K$\Omega$, 5%
R2-10 K$\Omega$, 5%
R3-510$\Omega$, 5%
R4-6.8 K$\Omega$, 5%
R5-510$\Omega$, 5%
R6-40.2 K$\Omega$, 1%
R7-40.2 K$\Omega$, 1%
R8-20 K$\Omega$, 1%
R9-200 K$\Omega$, 1%
R10-10 K$\Omega$, 1%
R11-10 K$\Omega$, 1%
R12-10 K, 5%
Resistor 31 (encoder) 1 M$\Omega$, 5%
Resistor 31 (decoder) 2 M$\Omega$ carbon resistance potentiometer
C1-1000 pf, 5%
C2-1000 pf, 5%
C3-10 $\mu$f, 10%
C4-3.3 $\mu$f, 10%
C5-330 pf, 5%
C6-680 pf, 5%
C7-15 $\mu$f, 10%
A1-Operational Amplifier ($\frac{1}{2}$) Motorola, Inc. MC 1458 or equivalent
A2-Operational Amplifier ($\frac{1}{2}$) Motorola, Inc. MC 1458 or equivalent Comparator 12-National Semiconductor LM311 or equivalent
D1-Diode 1N4148
D2-Diode 1N4148
Switch 24-C-MOS Quad Analog Switch RCA CD4016BE or equivalent
Flip-Flop 10-C-MOS Flip-Flop (½) RCA CD4013BE or equivalent Referring to FIG. 2, the decoder, shown in block diagram form, contains the same circuit elements connected in the same manner as the decoder of FIG. 1, except that comparator 12 and summing point 38 are omitted and resistor 31 is variable. The encoded signal is connected to the input of the decoder flip-flop while the integrator provides the output.

OPERATION

Referring again to FIG. 1, output 13 of comparator 12 and output 16 of flip-flop 10 are digital signals which are high when output 37 of audio signal source 36 (the input signal) is greater than reference signal output 35 of integrator 34 and low when the input signal is smaller than the reference. The value of the reference is determined by the previous values of the input signal so that output 16 represents the difference between the present and previous values of the input signal. The change with time, i.e., duty cycle, of output 16 represents the derivative (with respect to time) of the input signal.

When the encoder is operating in the differential mode, with switch 22 in the A position, output 16 is ac coupled into the input of filter 30, and the filter 30 extracts the information relating to the derivative of the input signal by separating the fundamental frequency of the duty cycle of output 16 from the other frequencies present in output 16, e.g., clock 14 and the higher harmonics of output 16. Resistor 31 assists in shaping the response of filter 30 and detector 32 by loading the input of detector 32 with a known, fixed resistance. Resistor 31 in the decoder performs the same function but is a variable resistor with a mid-range value equal to resistor 31 in the encoder, to allow the response of the decoder to be matched to that of the encoder. In the embodiment shown, the encoder and decoder may be matched to within ±0.5 db.

Envelope detector 32 half-wave detects the output of filter 30 to generate output 33 whose value is proportional to the duty cycle of output 16 and thereby to the derivative of the input signal. Standby reference input 40 to detector 32 is provided to provide a known offset for the detector when the input signal, and hence the output of filter 30, are zero, and may typically be as low as −40 db referenced to the maximum output of filter 30.

Integrator switch 24, operating under the control of inputs 19 and 21 from outputs 16 and 18, applies output 33 of detector 32 to inputs 42 and 44 of integrator 34 when, respectively, the input signal is greater than or less than the reference. Reference output 35 of integrator 34 increases at a rate proportional to the value of output 33 of detector 32, and thus to the derivative of the input signal, when detector output 33 is applied to input 42 and decreases accordingly when detector output 33 is applied to input 44. Inputs 42 and 44 are connected by switch 24, to, respectively, output 46 of integrator 34 and ground when they are not switched to detector output 33, thereby making integrator 34 self-stabilizing by chopping inputs 42 and 44 with outputs 16 and 18.

Reference output 35 of integrator 34 is the integrated derivative of the input signal and thereby closely follows the input signal by being a reconstruction of the input signal delayed in time by the period of clock 14.

The dynamic range of the encoder and decoder, when operating in the differential mode, is on the order of 60 to 70 db when the frequency of clock 14 is at least 10 times, and preferably between 15 and 25 times, the highest input signal frequency; and is frequency weighted by the ratio between the bandwidths of output 16 and output 37 of signal source 36.

The dynamic range of the encoder and decoder are further improved when operating in the preferred (differential)$^2$ mode. Dynamic ranges of better than 85 db may be achieved when the frequency of clock 14 is at least 15 times the highest input signal frequency, and to better than 90 db when the ratio is as high as 25 to 1. In this mode, switch 22 is placed in the B position, so that the input of filter 30 is output 26 of switch 24. The operation of switch 24 is controlled by outputs 16 and 18 of flip-flop 10, so that the input to filter 30 is the control signal modulated by the encoded signal, being a series of pulses which are time coincident with outputs 16 and 18, but, effectively, amplitude modulated by output 33 of detector 32, i.e., proportional to the derivative of the input signal. Future values of control signal output 33 are thereby determined, in part, by the present value of output 33 so that output 33 changes rapidly when the derivative of the input signal is large, i.e., the input signal is changing rapidly, and changes less rapidly when the derivative is small. This provides a further improvement in the response of the reference to changes in the amplitude or frequency of the input signal.

Figure 2:
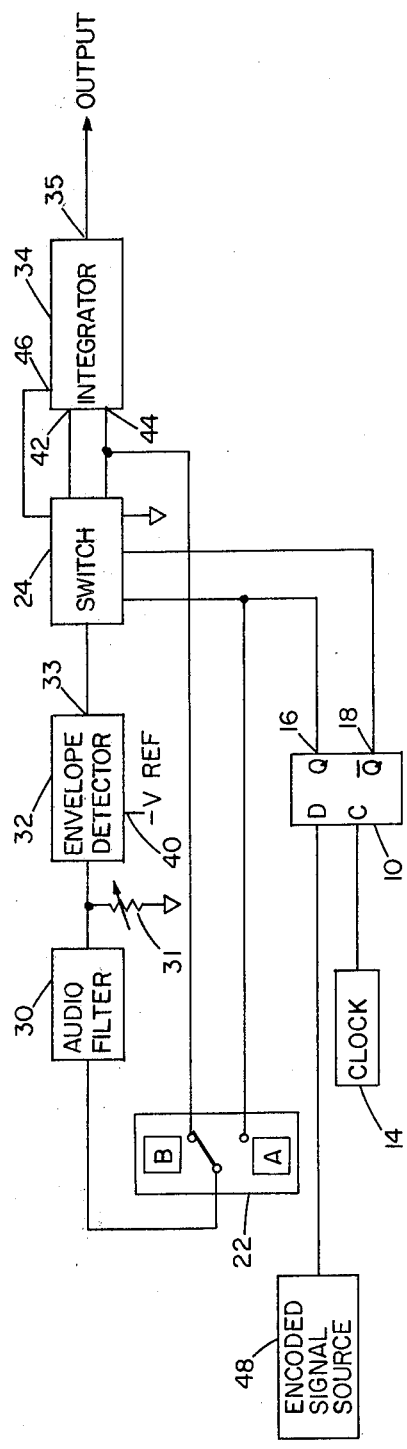
FIG. 2 is a block diagram of a CVSD decoder embodying the invention.

Referring to FIG. 2, an encoded signal from source 48 is applied to the input of decoder flip-flop 10 and is sampled at the same clock rate as in the encoder, so that outputs 16 and 18 of the decoder flip-flop are the same as those in the encoder. Audio filter 30, detector 32, switch 24, and integrator 34 generate reference signal output 35 in the same manner as, and identical to, that generated by the encoder. The integrator output is the decoder output and (as is the encoder reference signal) is an accurate reconstruction of the encoder input signal, tracking the encoder input to within ±0.5 db.

Other embodiments are within the following claims. E.g., while the embodiment of the invention described above relates to a CVSD system, the invention may be used in other encoding and decoding systems wherein the encoded signal represents the difference between a present value of the input signal and previous values of the input signal. Examples of such systems are voltage to frequency modulators, pulse width modulators, delta sigma modulators, and some differential pulse code modulators.

I claim:
1. In an electrical system of the type in which a digitally encoded signal is determined at least in part by the difference between a present value of an input signal and a reference signal representative of a past value of said input signal, improved circuitry for generating said reference signal, comprising
   extraction means including a filter for extracting from the pattern of bits in said digitally encoded signal information relating to the time derivative of said present value to provide a corresponding control signal, integrating means responsive to said control signal to provide said reference signal, and modulating means for feeding back to an input of said filter a modulated signal comprising said control signal modulated by said encoded signal.

2. The circuitry of claim 1 wherein said integrating means is comprised of integrating circuitry responsive to said control signal for providing said reference signal, and switching means for selecting the direction of change of said reference signal.

3. The system of claim 1 further comprising a selection means for selecting said input to said filter to be said modulated signal or said encoded signal.

4. The circuitry of claim 1 wherein said electrical system includes means for functioning as a continuously variable slope delta encoding system.

5. The circuitry of claim 1 wherein said extraction means further comprises an envelope detector rectifying the output of said filter to provide said control signal.

6. The circuitry of claim 5 wherein said extracting means further comprises a standby voltage source providing an offset to provide a control signal when said input signal is zero.

7. The system of claim 5 wherein said detector has a gain of at least 1 and a hold time constant of at least the period of the lowest frequency of said input signal.

8. The system of claim 7 wherein said period of said lowest input frequency is 50 ms.

9. The circuitry of claim 1 further comprising sampling means for providing said encoded signal, said sampling means being responsive to said input signal and said reference signal, and clock means for controlling said sampling means.

10. The system of claim 9 wherein said clock means provides a clock output at least 10 times the highest frequency of said input signal.

11. The system of claim 10 wherein said highest input frequency is 25 KHz.

12. The system of claim 10 wherein said clock output is at least 15 times the highest frequency of said input signal.

13. The system of claim 12 wherein said highest input frequency is 25 KHz.

14. The circuitry of claim 1 wherein said integrating means further comprises integrating circuitry to provide said reference signal, said integrating circuit having positive and negative slope control inputs controlling the direction and rate of change of said reference signal, and switching means being provided for selectively applying said control signal to said slope control inputs, said switching means being responsive to said encoded signal to increase or decrease said reference signal according to said difference between said present and past values of said input signal, and said extracting means further comprises an envelope detector responsive to an output of said filter to provide said control signal, and selection means for selecting said input to said filter to be said modulated signal or said encoded signal, and a standby voltage source providing an offset to provide a control signal when said input signal is zero, and said circuitry further comprises sampling means for providing said encoded signal, said sampling means responsive to said input signal and said reference signal, and clock means for controlling said sampling means.

15. The circuitry of claim 14 wherein said clock means provides a clock output at least ten times the highest frequency of said input signal, and said filter is a low pass filter having an upper roll-off frequency of at least said highest frequency of said input signal, said detector has a gain in a range of at least 1 and a hold time constant of at least the period of the lowest frequency of said input signal, and said integrating circuitry has a slew rate at the maximum value of said control signal of no more than 3 times the period of said highest frequency, said maximum value being at least the maximum amplitude of said input signal.

16. The circuitry of claim 14 wherein said input signal has a maximum frequency of 22 KHz, said lowest frequency of 20 Hz, and said maximum amplitude of 10 volts, said clock output is at least 250 KHz, said upper roll-off frequency of said filter is at least 24 KHz, said detector has a hold time constant of at least 50 ms and a gain of at least 1.2, the maximum value of said reference is at least 10 volts, and said integrating circuitry has a slew rate of at least 0.25 v/$\mu$s at said maximum control signal value and a slew rate of at least 2.5 mv/$\mu$s for a value of said control signal of at least 0.1 volts.

17. The circuitry of claim 1 wherein said filter is a low pass filter having a cutoff frequency of at least the highest frequency of said input signal.

18. The system of claim 17 wherein said highest input frequency is 25 KHz.

19. The system of claim 1 wherein the maximum value of said reference is at least the maximum amplitude of said input signal.

20. The system of claim 19 wherein said maximum input signal amplitude is 10 volts.

21. The system of claim 1 wherein the slew rate of said reference at the maximum value of said control signal is no greater than 3 times the period of the highest frequency of said input signal.

22. The system of claim 21 wherein said period of said highest input frequency is 40 $\mu$sec.

23. In an electrical system of the type in which a digitally encoded signal is determined at least in part by the difference between a present value of an input signal and a reference signal representative of a past value of said input signal, improved circuitry for generating said reference signal, comprising extraction means including a filter for extracting from the pattern of bits in said digitally encoded signal information relating to the time derivative of said present value to provide a corresponding control signal, and integrating means responsive to said control signal to provide said reference signal, wherein said integrating means comprises integrating circuitry to provide said reference signal, said integrating circuitry having positive and negative slope control inputs controlling the direction and rate of change of said reference signal, and switching means is provided for selectively providing said control signal to said slope control inputs.

24. The system of claim 23 wherein said switching means is responsive to said encoded signal to increase or decrease said reference according to said difference between said present value and said past value.

* * * * *

REEXAMINATION CERTIFICATE (329th)
United States Patent [19]
DeFreitas

[11] B1 4,190,801
[45] Certificate Issued  Apr. 2, 1985

[54] DIGITAL ENCODING CIRCUITRY

[75] Inventor: Richard E. DeFreitas, Westford, Mass.

[73] Assignee: DeltaLab Research, Inc., Chelmsford, Mass.

Reexamination Request:
No. 90/000,604, Aug. 8, 1984

Reexamination Certificate for:
Patent No.: 4,190,801
Issued: Feb. 26, 1980
Appl. No.: 875,336
Filed: Feb. 6, 1978

[51] Int. Cl.³ .................. H03K 13/22; H04B 12/04
[52] U.S. Cl. .................................. 375/30; 332/11 D
[58] Field of Search ............................. 375/28, 29, 30

[56] References Cited
U.S. PATENT DOCUMENTS
3,857,111  12/1974  Deschenes ........................ 375/30
4,071,825  1/1978   McGuffin ......................... 375/30

OTHER PUBLICATIONS

IEEE Transactions on Communication Technology, vol. Com-16, No. 1, Feb. 1968, pp. 157-162; Brolin, Stephen & Brown, James.
Conf. Rec., 1970 IEEE Int. Conf. on Commun., vol. 1, Jun. 8-10, 1970, pp. 7-33-7-48, by J. A. Greefkes.
"Studies of the Main Parameters in an Instantaneously Companded Delta Codec," by F. Busigny, P. A. Deschenes, and H. Stephenne, Department de genie electrique, Universite de Sherbrooke, Sherbrooke, Quebec, pp. 104-109, Proceedings of NEC, vol. XXVII, Oct. 9-11, 1972.

Primary Examiner—Michael A. Masinick

[57] ABSTRACT

In an electrical system of the type in which a digitally encoded signal is determined at least in part by the difference between a present value of an input signal and a reference signal representative of a past value of the input signal, improved circuitry for generating the reference signal. The improved circuitry comprises extraction means including a filter for extracting from the pattern of bits in the digitally encoded signal information relating to the time derivative of the present value of the input signal to provide a corresponding control signal, and integrating means responsive to the control signal to provide the reference signal.

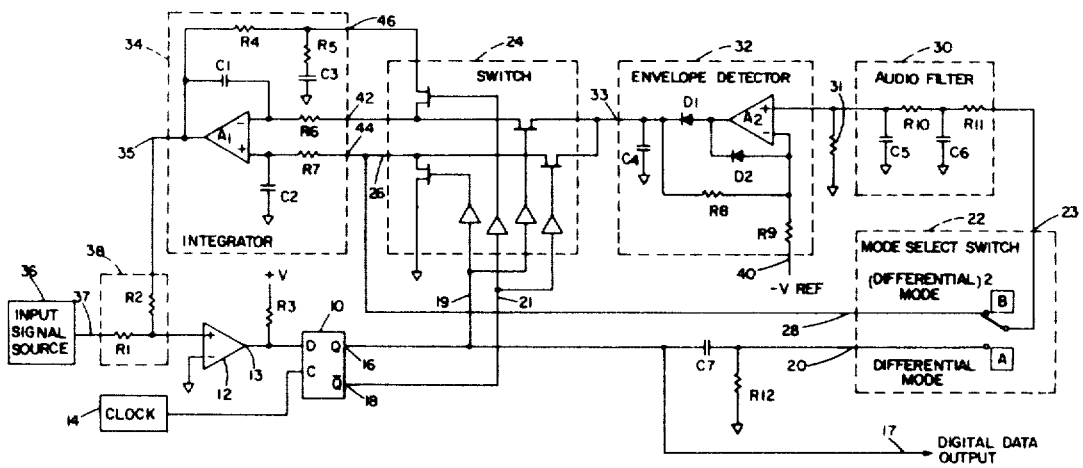

REEXAMINATION CERTIFICATE ISSUED UNDER 35 U.S.C. 307

NO AMENDMENTS HAVE BEEN MADE TO THE PATENT.

AS A RESULT OF REEXAMINATION, IT HAS BEEN DETERMINED THAT:

The patentability of claims 1-24 is confirmed.

* * * * *